US008674735B2

(12) United States Patent
Ito

(10) Patent No.: US 8,674,735 B2
(45) Date of Patent: Mar. 18, 2014

(54) PHASE ADJUSTING APPARATUS AND CAMERA

(75) Inventor: Daiki Ito, Tokyo (JP)

(73) Assignee: Nikon Corporation, Tokyo (JP)

( * ) Notice: Subject to any disclaimer, the term of this patent is extended or adjusted under 35 U.S.C. 154(b) by 333 days.

(21) Appl. No.: 12/654,744

(22) Filed: Dec. 30, 2009

(65) Prior Publication Data

US 2010/0194454 A1 Aug. 5, 2010

(30) Foreign Application Priority Data

Jan. 30, 2009 (JP) .................................. 2009-020076

(51) Int. Cl.
H03L 7/00 (2006.01)
(52) U.S. Cl.
USPC .......................................... 327/161; 327/163
(58) Field of Classification Search
USPC .................. 327/152, 153, 154, 161, 162, 163
See application file for complete search history.

(56) References Cited

U.S. PATENT DOCUMENTS

| 5,287,171 | A | 2/1994 | Ohtsubo et al. |
| 6,031,847 | A | 2/2000 | Collins et al. |
| 6,078,623 | A | 6/2000 | Isobe et al. |
| 6,157,229 | A | 12/2000 | Yoshikawa |
| 6,178,212 | B1 | 1/2001 | Akashi |
| 6,256,329 | B1 | 7/2001 | Ishizuka et al. |
| 6,654,897 | B1 | 11/2003 | Dreps et al. |
| 7,286,947 | B1 | 10/2007 | Cranford, Jr. et al. |
| 7,336,714 | B2 | 2/2008 | Goishi |
| 7,359,407 | B1 | 4/2008 | Mattos et al. |
| 7,496,137 | B2 | 2/2009 | Ichiyama et al. |
| 7,586,348 | B2 * | 9/2009 | Kim .............................. 327/163 |
| 7,696,802 | B2 * | 4/2010 | Shin ............................. 327/262 |
| 7,747,890 | B2 | 6/2010 | Lee |
| 7,911,249 | B2 * | 3/2011 | Wada ............................ 327/262 |
| 7,965,116 | B2 * | 6/2011 | Hatano et al. ................. 327/153 |
| 2004/0068682 | A1 | 4/2004 | Takei et al. |
| 2006/0036915 | A1 | 2/2006 | Takei et al. |
| 2006/0129869 | A1 | 6/2006 | Hendrickson et al. |
| 2008/0112522 | A1 | 5/2008 | Fukuda et al. |
| 2008/0276112 | A1 | 11/2008 | Matsui et al. |
| 2011/0228105 | A1 | 9/2011 | Ito |

FOREIGN PATENT DOCUMENTS

| JP | A-11-112483 | 4/1999 |
| JP | A-11-261485 | 9/1999 |
| JP | A-11-317732 | 11/1999 |
| JP | A-2000-151567 | 5/2000 |

(Continued)

OTHER PUBLICATIONS

Mar. 20, 2012 Office Action issued in U.S. Appl. No. 12/821,833.

(Continued)

*Primary Examiner* — Hai L Nguyen
(74) *Attorney, Agent, or Firm* — Oliff, PLC

(57) ABSTRACT

A phase adjusting apparatus includes a comparison code generating section, a calculating section, and a delay section. The comparison code generating section individually generates a first comparison code having a phase of a head code advanced and a second comparison code having the phase of the head code delayed, the head code being included in serial transfer data. The calculating section acquires a direction of adjustment of a phase of the serial transfer data using a comparison result of the head code and the first comparison code and a comparison result of the head code and the second comparison code. The delay section adjusts a delay amount of the serial transfer data based on the direction of adjustment of the phase.

5 Claims, 3 Drawing Sheets

(56) References Cited

FOREIGN PATENT DOCUMENTS

| JP | A-2000-196571 | 7/2000 |
|----|---------------|--------|
| JP | A-2000-196572 | 7/2000 |
| JP | A-2002-539526 | 11/2002 |
| JP | A-2004-127147 | 4/2004 |
| JP | A-2004-171254 | 6/2004 |
| JP | A-2008-067278 | 3/2008 |
| JP | A-2008-124714 | 5/2008 |

OTHER PUBLICATIONS

Feb. 12, 2013 Office Action issued in Japanese Patent Application No. 2009-020076 (with translation).

* cited by examiner

PHASE ADJUSTING APPARATUS AND CAMERA

CROSS REFERENCE TO THE RELATED APPLICATIONS

This application is based upon and claims the benefit of priority from Japanese Patent Application No. 2009-020076, filed on Jan. 30, 2009, the entire contents of which are incorporated herein by reference.

BACKGROUND

1. Field

The present application relates to a phase adjusting apparatus and a camera.

2. Description of the Related Art

Recently, accompanying an increase in the number of pixels in an image pickup device, there is an increasing demand for an electronics device, such as an electronic camera, to increase the transfer rate of digital data. In the design of such an electronics device, a relationship of phase between data and clock is maintained by suppressing variations in delay of data by controlling the impedance of a transfer line, making wires the same length, selecting the material of printed board, etc., and by performing a simulation of signal waveforms, etc.

It is known that the relationship of phase between data and clock changes due to heat generated in a continuous operation of an electronics device or the configuration of a peripheral circuit. As an example of measures to prevent this, Japanese Unexamined Patent Application Publication No. 2008-124714 discloses a configuration of a circuit that adjusts a relationship of phase between data and clock using two kinds of clock with different phases as well as adjusting a threshold value to determine the voltage of an input signal.

However, with the technique disclosed in Japanese Unexamined Patent Publication. No. 2008-124714 described above, it is actually difficult to determine a threshold value for determination of voltage and there is yet a room for improvement in a point that it becomes hard to maintain the precision of the two kinds of clock if the clock speed is increased.

SUMMARY

Because of the above, a proposition is to provide a unit that appropriately adjusts a relationship of phase between data and clock with a simpler configuration.

A phase adjusting apparatus according to one embodiment includes a comparison code generating section, a calculating section, and a delay section. The comparison code generating section individually generates a first comparison code having a phase of a head code advanced and a second comparison code having the phase of the head code delayed, the head code being included in serial transfer data. The calculating section acquires a direction of adjustment of a phase of the serial transfer data using a comparison result of the head code and the first comparison code and a comparison result of the head code and the second comparison code. The delay section adjusts a delay amount of the serial transfer data based on the direction of adjustment of the phase.

The phase adjusting apparatus in the one embodiment described above may further includes a control section that actuates the comparison code generating section in accordance with any of a number of times of communication of serial transfer data, a elapse of time, and an amount of change in temperature.

In the one embodiment described above, the delay section may adjust the delay amount during a period of time after effective data in a data area, among data included in the serial transfer data, has passed, the effective data in the data area being input following the head code.

In the one embodiment described above, the comparison code generating section may adjust a shift range of the phase of the first comparison code with respect to the head code and a shift range of the phase of the second comparison code with respect to the head code based on the comparison result of the head code and the first comparison code and the comparison result of the head code and the second comparison code, respectively.

Further, a camera or an electronics device that includes the phase adjusting apparatus in the one embodiment described above is also effective as a specific embodiment of the present application.

BRIEF DESCRIPTION OF THE DRAWINGS

Other propositions, features, and advantages described above will be made clearer by the following description.

DETAILED DESCRIPTION OF THE EMBODIMENTS (Configuration Example of Phase Adjusting Apparatus)

Figure 1:
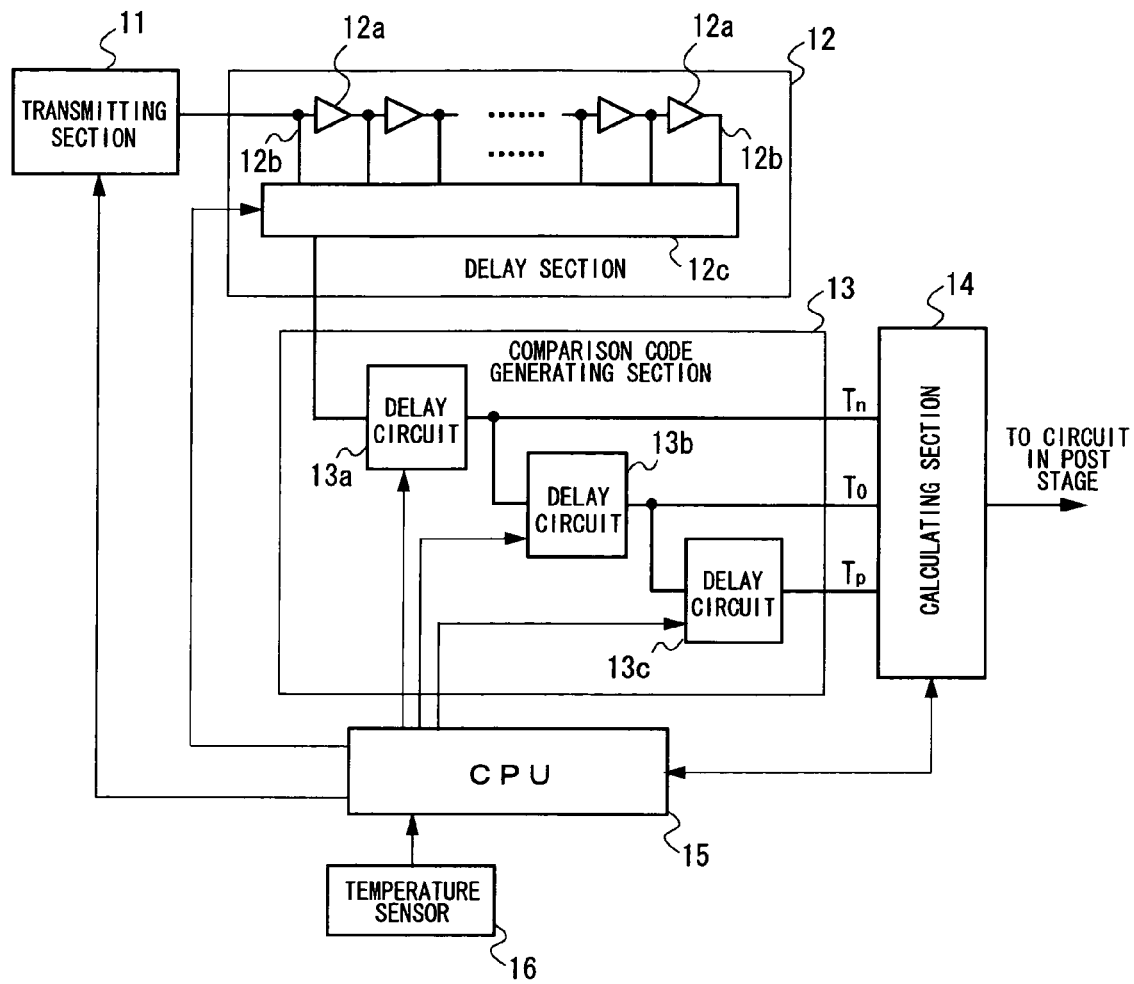
FIG. 1 is a schematic diagram showing a configuration example of a phase adjusting apparatus in one embodiment.

FIG. 1 is a schematic diagram showing a configuration example of a phase adjusting apparatus in one embodiment. The phase adjusting apparatus in FIG. 1 is mounted in an electronic camera, having a transmitting section 11, a delay section 12, a comparison code generating section 13, a calculating section 14, a CPU 15 and a temperature sensor 16 that detects a temperature of an electronic camera. The transmitting section 11, the delay section 12, the comparison code generating section 13, the calculating section 14 and the temperature sensor 16 are connected with the CPU 15, respectively.

The transmitting section 11 is a signal processing circuit that outputs a data packet (serial transfer data) to be transferred in a serial scheme to a circuit in a post stage. In an embodiment, the period of a clock signal is set to 500 MHz and a digital data signal is transmitted in a double data rate (DDR) scheme at a rate of 1 Gbps. The output of the transmitting section 11 is connected with the delay section 12.

Figure 2:
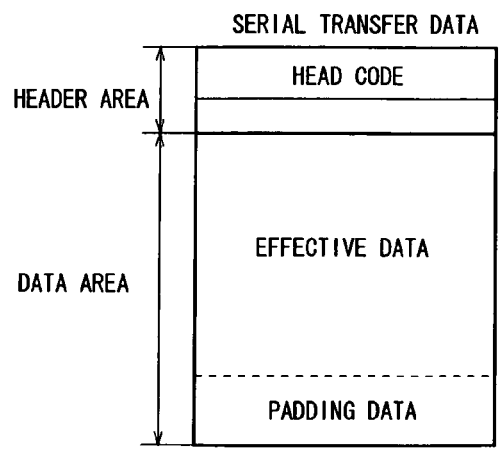
FIG. 2 is a diagram showing an example of a format of serial transfer data.

Here, FIG. 2 is a diagram showing an example of a format of serial transfer data in one embodiment. Serial transfer data in one embodiment has a header area and a data area.

The header area includes, for example, a head code indicative of the head of serial transfer data, data indicative of the number of bytes in the data area, etc. The data area includes effective data (image data etc.) that is an object of serial transfer, padding data attached to adjust the data length of the data area, etc.

It is assumed that the head code in one embodiment has, a bit depth of 12 bits for one word and includes data corresponding to four words in which a word "FFF (h)" in which "1" appears successively 12 times and a word "000 (h)" in which "0" appears successively 12 times ("FFF (h), 000 (h), FFF (h), 000 (h)") are arranged alternately side by side.

Returning to FIG. 1, the delay section 12 has a plurality of delay elements 12a (inverter etc.) connected in series across a plurality of stages, a plurality of paths 12b connected with the output of each delay element 12a, and a selector 12c connected to each path 12b described above. The selector 12c described above selects any one of the paths 12b in accordance with a specification by the CPU 15 and adjusts a delay amount of serial transfer data output from the delay section 12. The output of the selector 12c of the delay section 12 is connected to the comparison code generating section 13. In the following explanation, a delay adjustment value (delay stage number) in the delay section 12 is denoted by "N".

The comparison code generating section 13 is a circuit having one input and three outputs that generates data the phase of which is shifted forward and backward, respectively, with respect to input data. The comparison code generating section 13 has three programmable delay circuits 13a, 13b and 13c having the same configuration, respectively. In one embodiment, the delay amount of each of the delay circuits 13a, 13b and 13c is set to an identical value (Ns), respectively. It is also possible for the delay circuits 13a, 13b and 13c to change the value of the delay amount Ns in accordance with a specification by the CPU 15.

Figure 4:
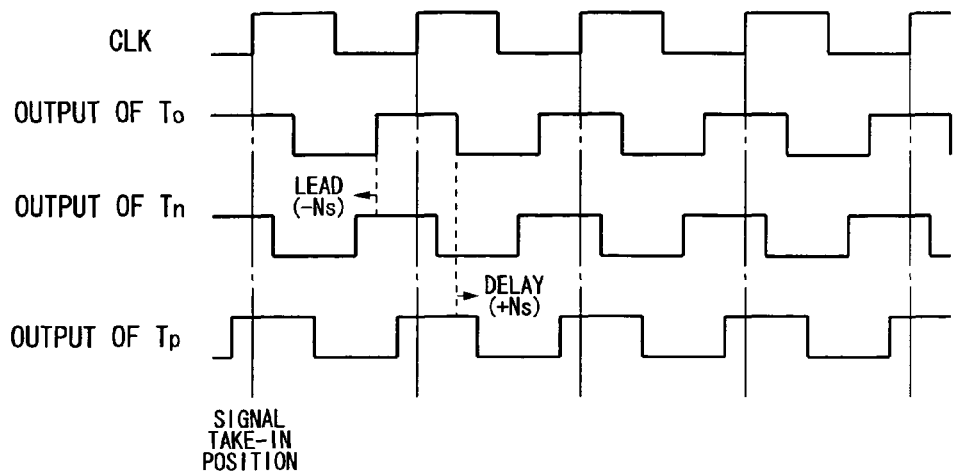
FIG. 4 is a diagram for explaining an output of a comparison code generating section.

Here, the input of the comparison code generating section 13 is connected to the delay circuit 13a. The output of the delay circuit 13a is branched into a signal line $T_n$ and the input of the delay circuit 13b. The output of the delay circuit 13b is branched into a signal line $T_o$ and the input of the delay circuit 13c. Then, the output of the delay circuit 13c is connected to a signal line $T_p$. Because of this, the output of the signal line $T_n$ does not pass through the delay circuit 13b, and therefore, its phase is advanced than that of the output of the signal line $T_o$ (refer to FIG. 4). The output of the signal line $T_p$ further passes through the delay circuit 13c, and therefore, its phase is delayed than that of the output of the signal line $T_o$ (refer to FIG. 4). The signal lines $T_n$, $T_o$ and $T_p$ are connected to the calculating section 14, respectively.

The delay amount Ns in each of the delay circuits 13a, 13b and 13c described above is set appropriately in accordance with the clock of serial transfer data. For example, when the clock is 500 MHz, one period is 2 ns, and therefore, the initial value of the above-mentioned delay amount Ns is set to about 200 ps. In this case, a variation amount corresponding to one stage of N, to be described later, and Ns is set to about 20 ps.

The calculating section 14 is a circuit that compares the head code output from the signal line $T_o$ with the head codes output from the signal lines $T_p$ and $T_n$, respectively, and acquires the direction of adjustment of the phase of serial transfer data. The calculating section 14 has a register (not shown schematically) that holds a state of a flag "Tn_ERR" indicative of the comparison result between the head code and a first comparison code, to be described later, and a state of a flag "Tp_ERR" indicative of the comparison result between the head code and a second comparison code, to be described later, respectively. Further, the calculating section 14 has a signal line through which the input from the signal line $T_o$ is output to a circuit in a post stage (not shown schematically) as it is.

The CPU 15 is a processor that totally controls the phase adjusting apparatus. The CPU 15 performs, for example, control of the output of serial transfer data in the transmitting section 11, determination of initiation of phase adjustment processing, to be described later, specification of switching of the path 12b for the selector 12c, specification of adjustment of each delay circuit of the comparison code generating section 13, etc.

Operation Example of Phase Adjusting Apparatus

Next, an operation example of the phase adjusting apparatus in one embodiment is explained. Serial transfer data output from the transmitting section 11 passes through the delay section 12, the comparison code generating section 13 and the calculating section 14 in a pipeline manner and is output to the post stage as it is. It is assumed that a value adjusted in advance to synchronize with a clock is set as the delay adjustment value N of the delay section 12.

During the period of normal operation described above, the CPU 15 monitors the number of times of transfer of serial transfer data, the time elapsed from the previous phase adjustment processing (or from the startup), and the temperature of the temperature sensor 16, respectively. Then, the CPU 15 starts the calculating section 14 to initiate phase adjustment processing when the CPU 15 determines either (1) the number of times of transfer of serial transfer data exceeds a threshold value, (2) a predetermined time has elapsed from the previous phase adjustment processing, or (3) the amount of change in temperature detected exceeds a threshold value.

Hereinafter, with reference to FIG. 3, an operation example of phase adjustment processing in one embodiment is explained.

Step S101: The calculating section 14 performs an initialization operation when receiving an instruction to initiate phase adjustment processing from the CPU 15. In S101, the calculating section 14 resets a flag "Tn_ERR" and a flag "Tp_ERR" to "0", respectively (Tn_ERR=0, Tp_ERR=0).

Then, in S101, the calculating section 14 initiates monitoring of the signal value of serial transfer data output from the signal lines $T_n$, $T_o$ and $T_p$, respectively.

Step S102: The calculating section 14 determines whether or not the head code of the serial transfer data is input from the signal lines $T_n$, $T_o$ and $T_p$. As an example, the calculating section 14 refers to data corresponding to two words of the data to be input and when there is an input of "FFF (h), 000 (h)", the calculating section 14 determines that the head code is input.

When the above-mentioned requirement is satisfied (YES side), the processing moves to S103. On the other hand, when the above-mentioned requirement is not satisfied (NO side), the calculating section 14 awaits for the input of the head code of serial transfer data.

Step S103: The calculating section 14 reads a predetermined part of the head code input from the signal line $T_n$ and acquires the first comparison code. In S103, the calculating section 14 acquires the first comparison code using the part of the third word of the head code. The first comparison code corresponds to a value when the output of the signal line $T_o$ is advanced by Ns in phase (−Ns) and sampled.

Step S104: The calculating section 14 determines whether or not the first comparison code (S103) coincides with the head code. That is, in S104, the calculating section 14 determines whether or not the first comparison code coincides with the third word ("FFF (h)") of the head code. When the above-mentioned requirement is satisfied (YES side), the processing moves to S106. On the other hand, when the above-mentioned requirement is not satisfied (NO side), the processing moves to S105.

Step S105: The calculating section 14 sets the state of the flag "Tn_ERR" to "1" (Tn_ERR=1).

Step S106: The calculating section 14 reads a predetermined part of the head code input from the signal line $T_p$ and acquires the second comparison code. In S106, the calculating section 14 acquires the second comparison code using the part of the third word of the head code. The second comparison code corresponds to a value when the output of the signal line $T_o$ is delayed by Ns in phase (+Ns) and sampled.

Step S107: The calculating section 14 determines whether or not the second comparison code (S106) coincides with the head code. That is, in S107, the calculating section 14 determines whether or not the second comparison code coincides with the third word ("FFF (h)") of the head code. When the above-mentioned requirement is satisfied (YES side), the processing moves to S109. On the other hand, when the above-mentioned requirement is not satisfied (NO side), the processing moves to S108.

Step S108: The calculating section 14 sets the state of the flag "Tp_ERR" to "1" (Tp_ERR=1).

Figure 3:
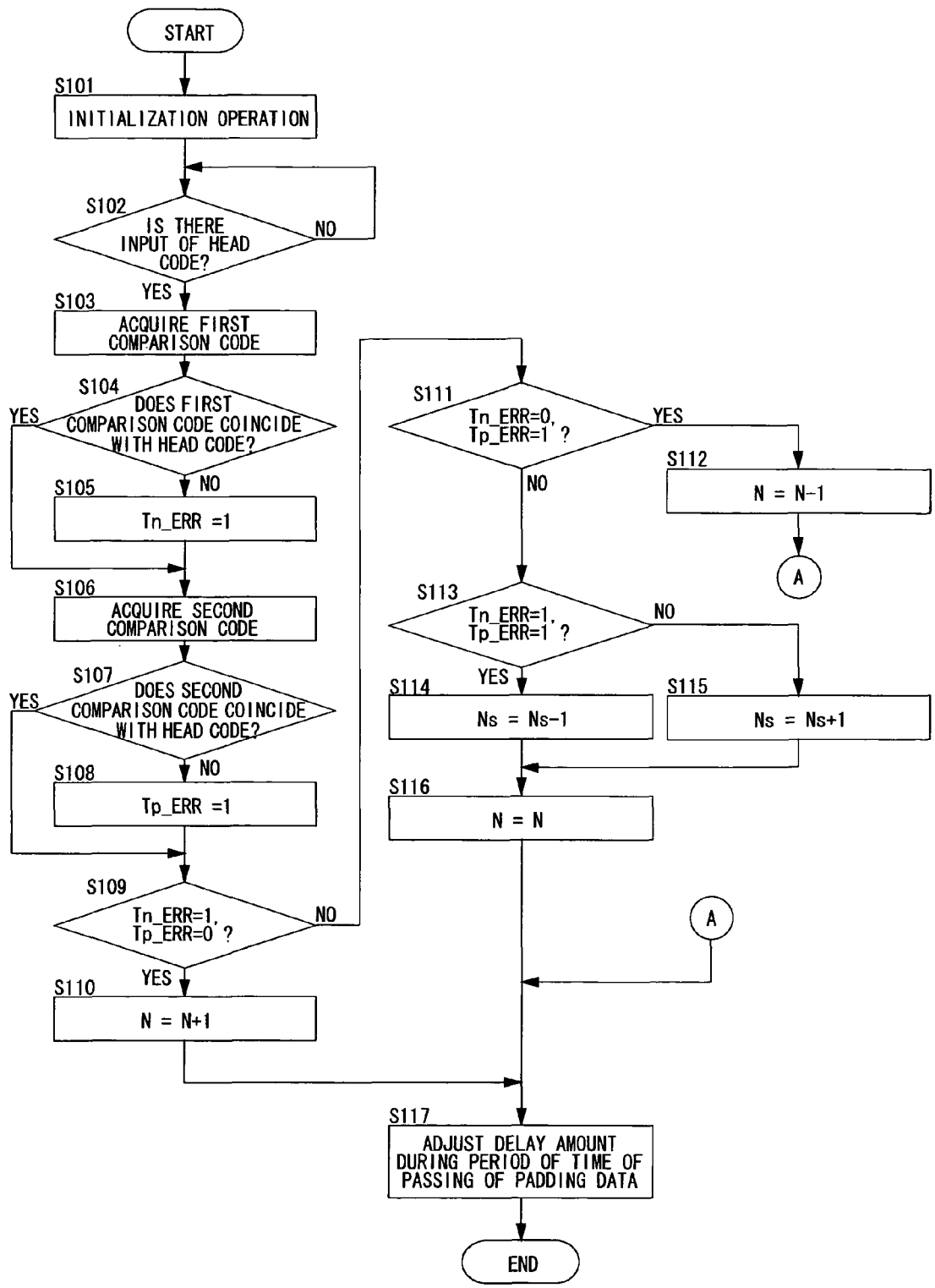
FIG. 3 is a flowchart showing an operation example of phase adjustment processing in one embodiment.

For the sake of simplicity, in FIG. 3, the processing from S103 to S108 is shown serially, however, in actuality, the processing from S103 to S105 described above and the processing from S106 to S108 described above are performed in parallel substantially at the same time.

Step S109: The calculating section 14 determines whether or not the state of the flag "Tn_ERR" is "1" and the state of the flag "Tp_ERR" is "0" (Tn_ERR=1, Tp_ERR=0). When the above-mentioned requirement is satisfied (YES side), the processing moves to S110. On the other hand, when the above-mentioned requirement is not satisfied (NO side), the processing moves to S111.

Figure 5:
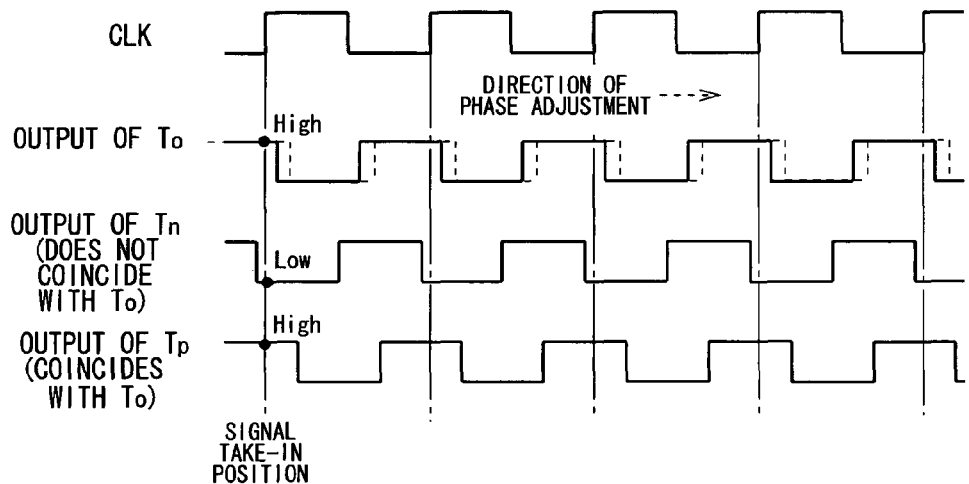
FIG. 5 is an explanatory diagram of an operation in S110 in FIG. 3.

Step S110: In this case, the output of the signal line $T_o$ produces a digital error when the phase is shifted in the direction in which the phase is advanced, however, does not produce any digital error when the phase is shifted in the direction in which the phase is delayed (refer to FIG. 5). Because of this, in S110, the calculating section 14 instructs the CPU 15 to shift a delay adjustment value of the delay section 12 by an amount corresponding to one stage in the delay direction (N=N+1). Due to this, by the processing in S117, to be described later, the phase of the signal line $T_o$ is fine-adjusted in the appropriate direction. Then, the processing moves to S117.

Step S111: The calculating section 14 determines whether or not the state of the flag "Tn_ERR" is "0" and the state of the flag "Tp_ERR" is "1" (Tn_ERR=0, Tp_ERR=1). When the above-mentioned requirement is satisfied (YES side), the processing moves to S112. On the other hand, when the above-mentioned requirement is not satisfied (NO side), the processing moves to S113.

Figure 6:
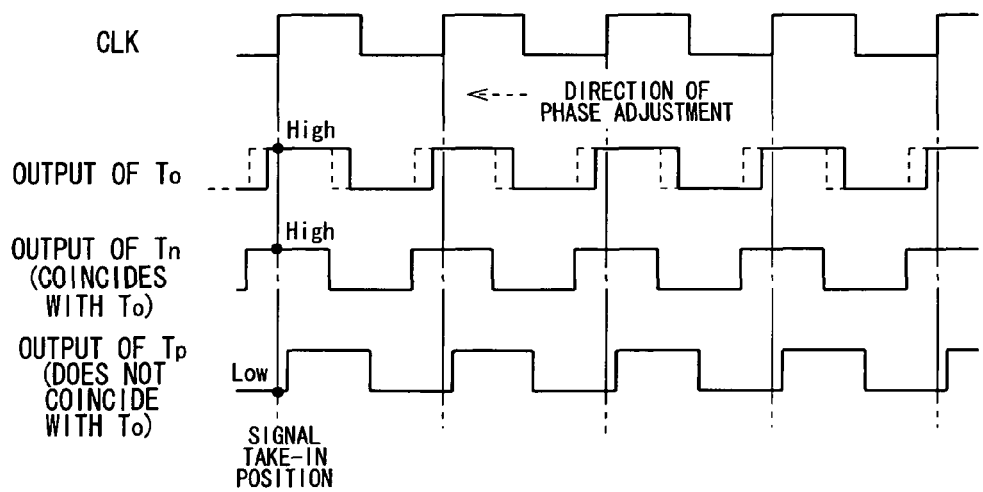
FIG. 6 is an explanatory diagram of an operation in S112 in FIG. 3.

Step S112: In this case, the output of the signal line $T_o$ produces a digital error when the phase is shifted in the direction in which the phase is delayed, however, does not produce any digital error when the phase is shifted in the direction in which the phase is advanced (refer to FIG. 6). Because of this, in S112, the calculating section 14 instructs the CPU 15 to shift a delay adjustment value of the delay section 12 by an amount corresponding to one stage in the lead direction (N=N−1). Due to this, by the processing in S117, to be described later, the phase of the signal line $T_o$ is fine-adjusted in the appropriate direction. Then, the processing moves to S117.

Step S113: The calculating section 14 determines whether or not the state of the flag "Tn_ERR" is "1" and the state of the flag "Tp_ERR" is also "1" (Tn_ERR=1, Tp_ERR=1). When the above-mentioned requirement is satisfied (YES side), the processing moves to S114. On the other hand, when the above-mentioned requirement is not satisfied (NO side), the processing moves to S115.

Step S114: In this case, the delay amount Ns of the delay circuit is large, and therefore, it is determined that a digital error is produced when the phase of the signal line $T_o$ is shifted in either direction. Because of this, in S114, the calculating section 14 instructs the CPU 15 to reduce the delay amount Ns in each delay circuit by an amount corresponding to one stage (Ns=Ns−1). Due to this, in the next phase adjustment processing, the phase differences of the outputs of the signal lines $T_n$ and $T_p$ are reduced, respectively, with respect to the output of the signal line $T_o$. Because of this, it is made possible for the calculating section 14 to make a phase adjustment in finer steps. Then, the processing moves to S116.

Step S115: In this case, it is determined that no digital error is caused even if the phase of the signal line $T_o$ shifts in either direction. Because of this, in S115, the calculating section 14 instructs the CPU 15 to increase the delay amount Ns in each delay circuit by an amount corresponding to one stage (Ns=Ns+1). Due to this, in the next phase adjustment processing, the phase differences of the outputs of the signal lines $T_n$ and $T_p$ are increased, respectively, with respect to the output of the signal line $T_o$. Because of this, it is made possible for the calculating section 14 to make a phase adjustment while viewing a wider range in the direction of time axis.

Step S116: The calculating section 14 instructs the CPU 15 to maintain the delay adjustment value of the delay section 12 as it is (N=N).

Step S117: In response to the instruction from the calculating section 14 (S110, S112, S114 to S116), the CPU 15 adjusts the delay adjustment value N of the delay section 12 or the delay amount Ns in each delay circuit. Then, the CPU 15 returns to the normal operation as well as ending the phase adjustment processing.

Here, the adjustment of the delay adjustment value N or the delay amount Ns is made by making use of the period of time during which the padding data of serial transfer data is passing (period of time after the effective data has passed). Because of this, it is unlikely that the transfer of effective data of serial transfer data is impeded by the phase adjustment processing. The explanation of the flowchart in FIG. 3 is completed as above.

The adjustment of the delay adjustment value N or the delay amount Ns may be made at any time after the effective data has passed or after the effective data has passed and before the next serial data is transferred. For example, it may also be possible for the CPU 15 to adjust the delay adjustment value N or the delay amount Ns after the padding data has passed and before the next serial data arrives. When no padding data is attached to serial data, it may also be possible to adjust the delay adjustment value N or the delay amount Ns after the effective data has passed (after serial data is transferred) and before the next serial data arrives.

In the above-mentioned one embodiment, the calculating section 14 acquires, as well as generating the first comparison code and the second comparison code having a phase difference with respect to the head code, the direction of adjustment of the phase of serial transfer data based on whether or not their identity exists (S103 to S109, S111).

Because of this, in the one embodiment, it is possible to easily suppress a shift in phase of serial transfer data resulting from a change in temperature environment of the apparatus etc.

Further, in the one embodiment, the calculating section 14 performs phase adjustment processing using the head code of serial transfer data. Because of this, in the one embodiment, it is possible to make a phase adjustment without impeding the above-mentioned data transfer in a circumstance in which serial transfer data is transferred continuously (for example, when data of motion picture is transferred).

It may also be possible for a user to arbitrarily set the initial value of Ns, the amount of variation corresponding to one stage of N and Ns, or they may be set dynamically by switching them based on information about temperature etc.

<Supplementary Items of the Embodiment>

(1) The phase adjusting apparatus of the present invention is not limited to an example in which the apparatus is incorporated in an electronic camera, but the apparatus may be incorporated in another electronics device. In the above-mentioned embodiment, an example is explained, in which serial transfer is performed using one channel, however, it is of course obvious that the present invention can be applied to the case of a plurality of channels.

(2) In the above-mentioned embodiment, an example is explained, in which the comparison code is generated by making use of the third word of the head code of serial transfer data, however, it may also be possible for the calculating section 14 to generate the comparison code by making use of only, for example, part of an arbitrary word included in the head code (signal string corresponding to several bits). In the case described above, it may also be possible for the calculating section 14 to generate the comparison code across a plurality of words.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A phase adjusting apparatus comprising:
   an output section outputting a first serial transfer data including a head code indicating a head of a serial transfer data, a first data, and a first padding data;
   a first setting section setting a first delay amount to adjust a phase of the first serial transfer data being output from the output section;
   a first delay section outputting a first output which is the first serial transfer data being output from the output section in which a phase thereof is delayed by a phase equivalent to a first time based on the first delay amount set by the first setting section;
   a second setting section setting a second delay amount to adjust a phase of the first output being output from the first delay section;
   a second delay section outputting a second output which is the first output being delayed by a phase equivalent to a second time based on the second delay amount set by the second setting section. a third output which is the second output being delayed by a phase equivalent to the second time based on the second delay amount set by the second setting section. and a fourth output which is the third output being delayed by a phase equivalent to the second time based on the second delay amount set by the second setting section;
   a calculating section calculating a delay amount for the first delay section to adjust a phase of a second serial transfer data being output from the output section following the first serial transfer data based on a first comparison result and a second comparison result. the first comparison result comparing the head code included in the third output being output from the second delay section with the head code included in the second output being output from the second delay section in a predetermined timing. and the second comparison result comparing the head code included in the third output being output from the second delay section with the head code included in the fourth output being output from the second delay section in a predetermined timing, wherein
   the first setting section sets the delay amount calculated by the calculating section; and
   the delay section outputs a fifth output which is the second serial transfer data being delayed by a phase equivalent to the delay amount set by the first setting section.

2. The phase adjusting apparatus according to claim 1, further comprising:
   a control section initiating the calculating section when a number of times a serial transfer data transfers exceeds a predetermined number of times.

3. The phase adjusting apparatus according to claim 1, further comprising:
   a control section initiating the second delay section when a predetermined time passed since the calculating section calculated the delay amount.

4. The phase adjusting apparatus according to claim 1, further comprising:
   a control section initiating the calculating section when an amount of change in temperature being detected exceeds a predetermined amount.

5. A camera comprising the phase adjusting apparatus according to claim 1, which is disposed in the camera.

* * * * *